United States Patent
Lin et al.

(10) Patent No.: US 10,171,097 B1
(45) Date of Patent: Jan. 1, 2019

(54) CORRECTING DEVICE OF SUCCESSIVE APPROXIMATION ANALOG-TO-DIGITAL CONVERSION

(71) Applicant: REALTEK SEMICONDUCTOR CORPORATION, Hsinchu (TW)

(72) Inventors: Sheng-Hsiung Lin, Tainan (TW); Jie-Fan Lai, Hsinchu (TW); Liang-Wei Huang, Hsinchu (TW); Chih-Lung Chen, Hsinchu County (TW); Shih-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/048,479

(22) Filed: Jul. 30, 2018

(30) Foreign Application Priority Data

Aug. 15, 2017 (TW) .............................. 106127560 A

(51) Int. Cl.
*H03M 1/06* (2006.01)
*H03M 1/08* (2006.01)

(52) U.S. Cl.
CPC ................................ *H03M 1/0863* (2013.01)

(58) Field of Classification Search
CPC .... H03M 1/0863; H03M 1/06; H03M 1/1023; H03M 1/203; H03M 1/207; H03M 1/66; H03M 1/747; H03M 1/00
USPC .................................. 341/118, 155, 144, 158
See application file for complete search history.

(56) References Cited

U.S. PATENT DOCUMENTS

| 8,872,691 B1 * | 10/2014 | Stepanovic | H03M 1/06 341/144 |
| 8,957,802 B1 * | 2/2015 | Evans | H03M 1/0863 341/155 |
| 8,988,268 B2 * | 3/2015 | Sugimoto | H03M 1/38 341/118 |
| 9,484,945 B1 * | 11/2016 | Wan | H03M 1/46 |

(Continued)

OTHER PUBLICATIONS

Akira Shikata et al., "A 0.5 V 1.1 MS/sec 6.3 fJ/Conversion-Step SAR-ADC With Tri-Level Comparator in 40 nm CMOS", 2012 IEEE.

(Continued)

*Primary Examiner* — Jean B Jeanglaude
(74) *Attorney, Agent, or Firm* — WPAT, PC

(57) ABSTRACT

Disclosed is a correcting device of successive approximation analog-to-digital conversion. The correcting device includes a successive approximation register analog-to-digital converter (SAR ADC) and a digital circuit. The SAR ADC is configured to generate a digital output. The digital circuit is configured to determine whether the digital output conforms to a metastable output, and correct the digital output when the digital output conforms to the metastable output. The metastable output is related with a metastable binary comparison-results sequence including successive K comparison results such as 110000 or 001111. The K comparison results include a first comparison result, a second comparison result and successive M comparison results in turn. The first comparison result and the second comparison result are the same; the M comparison results are the same; each of the first comparison result and the second comparison result is different from any of the M comparison results.

12 Claims, 5 Drawing Sheets

(56) References Cited

U.S. PATENT DOCUMENTS

2014/0327562 A1* 11/2014 Stepanovic ............. H03M 1/06
    341/158

OTHER PUBLICATIONS

Hyeok-Ki Hong et al., "A Decision-Error-Tolerant 45 nm CMOS 7b 1 GS/s Nonbinary 2b/Cycle SAR ADC", 2014 IEEE.

Hongda Xu et al., "A 78.5dB-SNDR Radiation- and Metastability-Tolerant Two-Step Split SAR ADC Operating up to 75MS/s with 24.9mW Power Consumption in 65nm CMOS", ISSCC 2017 / Session 28 / Hybrid ADCS / 28.6.

K. Okada et al., "A 2.4-mW 25-MHz BW 300-MS/s Passive Noise Shaping SAR ADC with Noise Quantizer Technique in 14-nm CMOS", 2017 Symposium on VLSI Circuits Digest of Technical Papers.

* cited by examiner

CORRECTING DEVICE OF SUCCESSIVE APPROXIMATION ANALOG-TO-DIGITAL CONVERSION

BACKGROUND OF THE INVENTION

1. Field of the Invention

The present invention relates to a correcting device, especially to a correcting device of analog-to-digital conversion.

2. Description of Related Art

In recent years, in order to achieve low complexity and power consumption, a successive approximation register analog-to-digital converter (SAR ADC) is widely used. However, the operation of an SAR ADC highly relies on the output of a comparator of the SAR ADC, the comparator may output an incorrect comparison result due to the comparator receiving two input signals of similar amplitudes, and the incorrect comparison result may lead to the following comparison results being incorrect and cause the output of the SAR ADC to be significantly inaccurate. The above-mentioned problem is usually called the occurrence of metastability of the SAR ADC.

In order to solve problems caused by the occurrence of metastability of an SAR ADC, there are several techniques as described below:

(1) Using a timer to detect whether the comparison duration of a comparator of the SAR ADC is too long, and thereby determining whether a metastable problem occurs due to the comparator receiving two input signals having similar amplitudes. This technique is limited to specific applications, and is found in the following literature: Akira Shikata, Student Member, IEEE, Ryota Sekimoto, Student Member, IEEE, Tadahiro Kuroda, Fellow, IEEE, and Hiroki Ishikuro, Member, IEEE, "*A 0.5 V 1.1 MS/sec 6.3 fJ/Conversion-Step SAR-ADC With Tri-Level Comparator in 40 nm CMOS*", IEEE JOURNAL OF SOLID-STATE CIRCUITS, VOL. 47, NO. 4, APRIL 2012.

(2) Adjusting a decision transition-point of an SAR ADC's comparator's output and adjusting a decision transition-point of a bit value inputted by a digital-to-analog converter (DAC) of the SAR ADC. This manner is incapable of realizing closed-loop calibration, and is found in the following literature: Hyeok-Ki Hong, Student Member, IEEE, Wan Kim, Student Member, IEEE, Hyun-Wook Kang, Sun-Jae Park, Michael Choi, Ho-Jin Park, and Seung-Tak Ryu, Senior Member, IEEE, "*A Decision-Error-Tolerant 45 nm CMOS 7b 1 GS/s Nonbinary 2b/Cycle SAR ADC*", IEEE JOURNAL OF SOLID-STATE CIRCUITS, VOL. 50, NO. 2, FEBRUARY 2015.

SUMMARY OF THE INVENTION

In view of the drawbacks of the prior arts, an object of the present invention is to provide a correcting device of successive approximation analog-to-digital conversion capable of solving the problems of metastability.

The present invention discloses a correcting device of successive approximation analog-to-digital conversion, capable of correcting a digital output. An embodiment of the correcting device includes a successive approximation register analog-to-digital converter (SAR ADC) and a digital circuit. The SAR ADC is configured to generate a digital output. The digital circuit is configured to determine whether the digital output conforms to a metastable output, and correct the digital output according to predetermined correction if the digital output conforms to the metastable output, in which the metastable output is related with a metastable binary comparison-results sequence including successive K comparison results (e.g., 110000 or 001111). The said K results include a first comparison result (e.g., 1 or 0), a second comparison result (e.g., 1 or 0) and M comparison results (e.g., 0000 or 1111) in turn, in which the first and the second comparison results are the same, each of the first and the second comparison results is different from any of the M comparison results, and each of the K and the M is a positive integer.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

Figure 1:
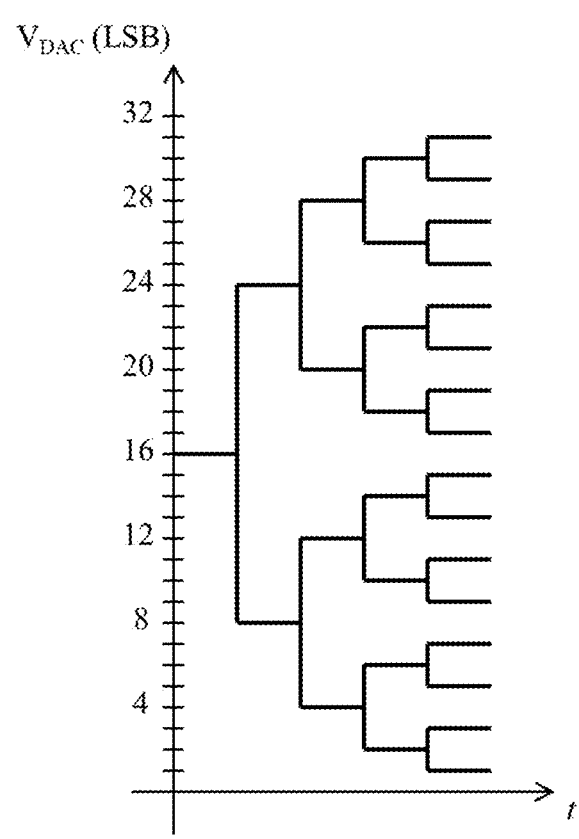
FIG. 1 illustrates an instance of all output options of an SAR ADC's digital-to-analog converter along a time axis.

FIG. 1 shows an instance of all output options ($V_{DAC}$) of a digital-to-analog converter (DAC) of a successive approximation register analog-to-digital converter (SAR ADC) along a time axis (t). The high voltage level of the least significant bit (LSB) of the DAC is a unit of every output option. The DAC is a 5-bits DAC; the first output option of the DAC is a middle value "$2^4$LSB" (i.e., 16LSB); the second output option of the DAC is "the middle value$\pm 2^3$LSB" (i.e., 16LSB$\pm 2^3$LSB=24LSB or 8LSB); the third output option of the DAC is "the second output option$\pm 2^2$LSB" (i.e., 28LSB, 20LSB, 12LSB, or 4LSB); the fourth output option of the DAC is "the third output option$\pm 2^1$LSB" (i.e., 30LSB, 26LSB, 22LSB, 18LSB, 14LSB, 10LSB, 6LSB, or 2LSB); and the fifth output option of the DAC is "the fourth output option$\pm 2°$ LSB".

Figure 2:
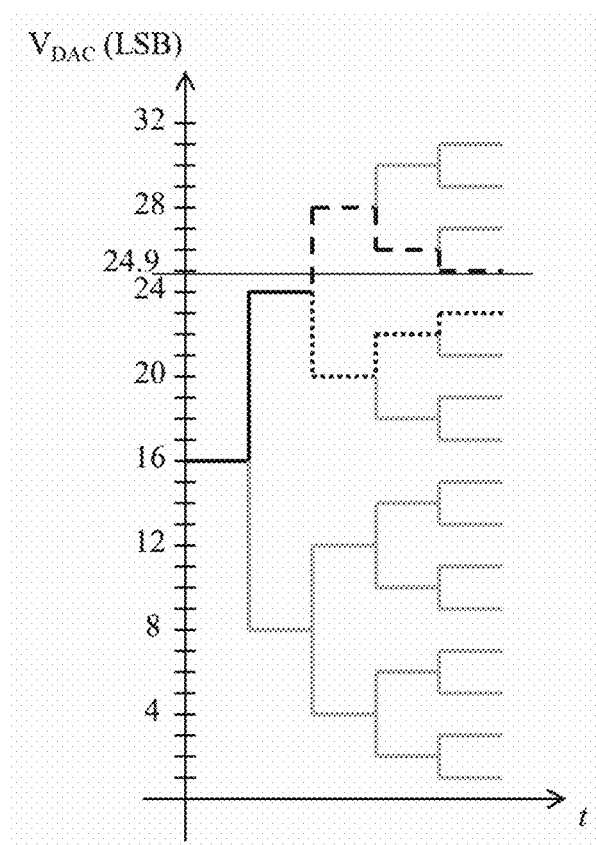
FIG. 2 illustrates an instance of a sampled input value inputted to the SAR ADC of FIG. 1 for the execution of a comparison operation.

FIG. 2 shows an instance of a sampled input value 24.9LSB inputted to the SAR ADC of FIG. 1 for the SAR ADC executing a comparison operation for five times to generate a digital value representing the sampled input value, in which the light-color solid line of FIG. 1 indicates the optional values that are not outputted by the DAC during the comparison operation. According to FIG. 2, when executing the comparison operation for the first time, a first output value (i.e., the aforementioned middle value) 16LSB of the DAC is far less than the sampled input value 24.9LSB, and thus the DAC will output a second output value (16LSB+8LSB=24LSB) to approach the sampled input value according to the first comparison result in a normal condition. Next, since the second output value 24LSB of the DAC is quite close to the sampled input value 24.9LSB, if the comparator of the SAR ADC is incapable of accurately determining which one is larger, the DAC will output a third output value being "24LSB+4LSB=28LSB" (as depicted by the short-dashed line of FIG. 2) or "24LSB−4LSB=20LSB" (as depicted by the dotted line of FIG. 2). If the following three comparison results are reliable, the overall five comparison results will be 00111 (as depicted by the black solid line and the short-dashed line of FIG. 2) or 01000 (as shown by the black solid line and the dotted line of FIG. 2), in which "0" stands for a comparison result indicating an output value of the DAC less than the sampled input value and "1" stands for a comparison result indicating an output value of the DAC greater than the sampled input value. Regardless of the comparison results being 00111 or 01000, a person of ordinary skill in the art can appreciate that when the last few comparison results (i.e., 111 or 000) are the same, the difference between the third output value (28LSB or 20LSB) of the DAC and the sampled input value (24.9LSB) is large so that none of the following output values (i.e., the fourth and the fifth output values) of the DAC can reach the sampled input value. As a result, the person of ordinary skill in the art can infer that the second output value (i.e., 24LSB) of the DAC is quite close to the sampled input value (24.9LSB) and thereby infer that the second comparison result of the comparator of the SAR ADC could be incorrect (i.e., a metastable problem could occur during the second comparison operation); in other words, the output of the SAR ADC could be a metastable output. It should be noted that the definitions of the above-mentioned "0" and "1" can be exchanged.

Figure 3:
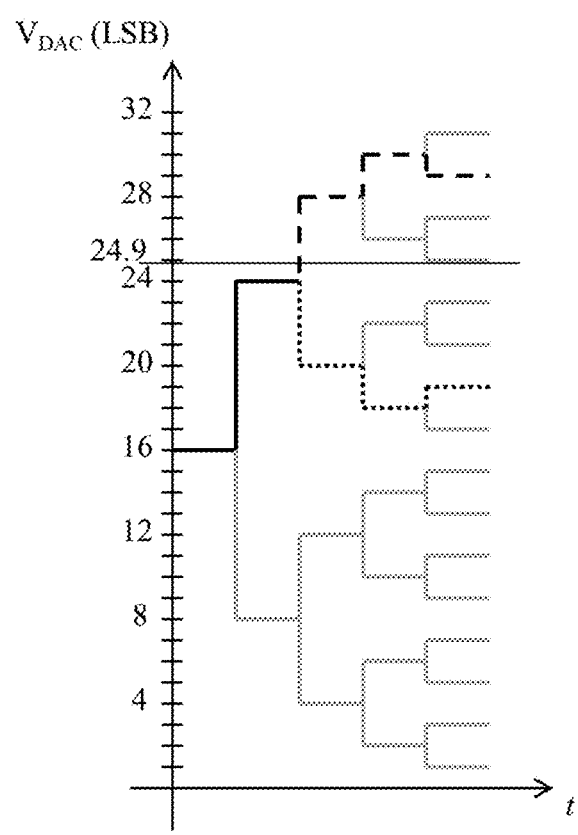
FIG. 3 illustrates another instance of a sampled input value inputted to the SAR ADC of FIG. 1 for the execution of a comparison operation.

FIG. 3 shows another instance of a sampled input value (24.9LSB) inputted to the SAR ADC of FIG. 1 for the SAR ADC executing a comparison operation, in which the light-color solid line indicates the optional values that are not outputted by the DAC during the comparison operation. In comparison with FIG. 2, the third comparison result of FIG. 3 is obviously incorrect, which could be the consequence of the previous abnormal comparison operation. More specifically, because the second output value of the DAC is quite close to the sampled input value, the SAR ADC outputs the incorrect third comparison result. The overall comparison results of FIG. 3 could be 00011 (as shown by the black solid line and the short-dashed line of FIG. 3) or 01100 (as shown by the black solid line and the dotted line of FIG. 3). The difference between any of the comparison results of FIG. 3 (i.e., "00011" or "01100") and the correct comparison results "00111" is larger than the difference between any of the comparison results of FIG. 2 (i.e., "00111" or "01000") and the correct comparison results; therefore, the comparison results of FIG. 3 in comparison with those of FIG. 2 have more need to be corrected. According to FIG. 3, regardless of the SAR ADC's comparison results being 00011 or 01100, the second and the third comparison results (i.e., "00" of "00011" or "11" of "01100") are the same, but each of the second and the third comparison results is different from any of the comparison results (i.e., "11" of "00011" or 00 of "01100") obtained after the third comparison result. This comparison-results pattern can be used to determine whether comparison results of an SAR ADC should be corrected.

Figure 4:
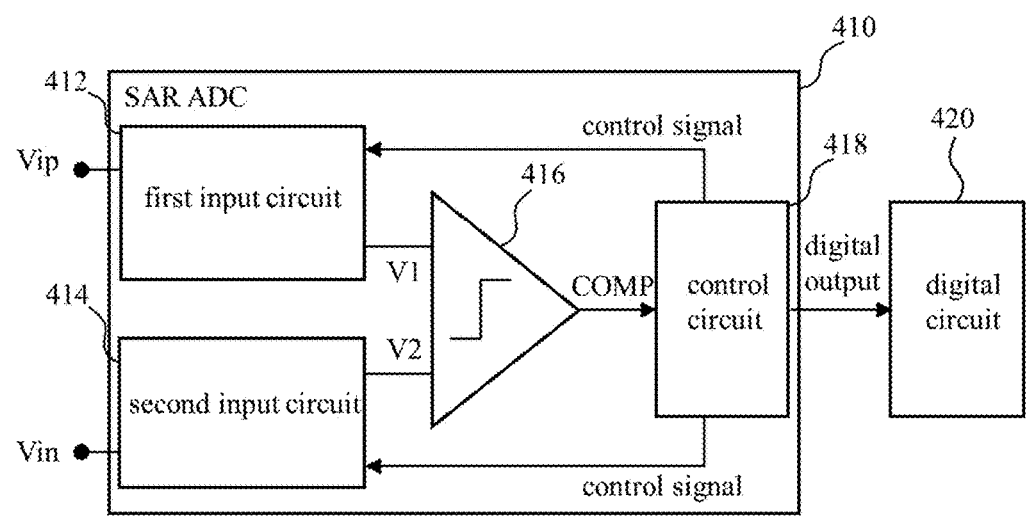
FIG. 4 illustrates the correcting device of successive approximation analog-to-digital conversion according to an embodiment of the present invention.

Based on the aforementioned research, the present invention discloses a correcting device of successive approximation analog-to-digital conversion capable of adaptively correcting a digital output of an SAR ADC. FIG. 4 shows an embodiment of the correcting device of the present invention. The correcting device 400 of FIG. 4 includes an SAR ADC 410 and a digital circuit 420. The SAR ADC 410 is configured to generate at least one digital output which could be/include a sequence (e.g., binary sequence) and/or a value (e.g., decimal value). In this embodiment, the SAR ADC 410 includes: a first input circuit 412 configured to generate a first input signal V1 according to a positive-end signal Vip of a differential signal; a second input circuit 414 configured to generate a second input signal V2 according to a negative-end signal Vin of the differential signal; a comparator 416 configured to compare the first input signal V1 with the second input signal V2 and thereby generate a comparison result (COMP); and a control circuit 418 configured to generate a part of the digital output according to the comparison result, and the control circuit 418 further configured to generate a control signal according to the comparison result so as to control charge-redistribution operations of the first input circuit 412 and the second input circuit 414 for renewing the first input signal V1 and the second input signal V2 which will be inputted to the comparator 416 for comparison next time. The above-described operation of SAR ADC 410 is well known in this industrial field, and thus the detail is omitted here. The digital circuit 420 is configured to determine whether the digital output conforms to a metastable output, and correct the digital output according to predetermined correction when the digital output conforms to the metastable output, in which the metastable output is related with a metastable binary comparison-results sequence (e.g., (1) any set of the comparison results of FIG. 3 (i.e., "00011" or "01100"); (2) ?????001111 or ?????110000, in which "?" could be "1" or "0" while the amount of "?" is related to the amount of bits of the SAR ADC 410 and not less than one). The metastable binary comparison-results sequence includes successive K comparison results (e.g., 001111 or 110000), and the K comparison results include a first comparison result, a second comparison result following the first comparison result, and M comparison results following the second comparison result, in which the first and the second comparison results (e.g., "00" of "001111" or "11" of "110000") are identical, each of the first and the second comparison results is different from any of the M comparison results (e.g., "1111" of "001111" or "0000" of "110000"), and each of the K and the M is a positive integer. In an embodiment of the present invention, the last one of the M comparison results is used to determine the value of the least significant bit (LSB) of the SAR ADC 410. In an embodiment of the present invention, the M is not less than two. In an embodiment of the present invention, if the SAR ADC 410 is a N-bits ADC, $$\frac{M}{N}$$

is not less than 25%.

On the basis of the above, in an embodiment of the present invention, the digital output is a binary sequence, and when the binary sequence is the comparison results of the SAR ADC 410, the digital circuit 420 determines whether the pattern of the binary sequence is identical to the pattern of the aforementioned metastable binary comparison-results sequence so as to find out whether the digital output conforms to the metastable output; in the meantime, the aforementioned predetermined correction could be a predetermined binary sequence (or predetermined X sequential values, in which X is a positive integer not greater than K), and the digital circuit 420 replaces/corrects the binary sequence of the digital output with the predetermined correction (or replaces/corrects X sequential values (e.g., the last K sequential values when X=K) of the binary sequence of the digital output with the predetermined X sequential values) to accomplish correction. In another embodiment of the present invention, the digital output is a binary sequence, and when the binary sequence is the analog-to-digital conversion results of the SAR ADC 410, the digital circuit 420 determines whether the pattern of the binary sequence is identical to the pattern of an analog-to-digital output sequence corresponding to the metastable binary comparison-results sequence so as to find out whether the digital output conforms to the metastable output; in the meantime, the aforementioned predetermined correction could be a predetermined binary sequence (or predetermined X sequential values, in which X is a positive integer not greater than K), and the digital circuit 420 replaces/corrects the binary sequence of the digital output with the predetermined correction (or replaces/corrects X sequential values (e.g., the last K sequential values when X=K) of the binary sequence of the digital output with the predetermined X sequential values) to accomplish correction. In a further embodiment, the digital output is a decimal value, and the digital circuit 420 determines whether the decimal value is identical to a metastable decimal value corresponding to the metastable binary comparison-results sequence or determines whether the pattern of a binary sequence corresponding to the decimal value of the digital output is identical to the pattern of the metastable binary comparison-results sequence (or the pattern of an analog-to-digital output sequence corresponding to the metastable binary comparison-results sequence), so as to determine whether the digital output conforms to the metastable output; in the meantime, the predetermined correction could be a predetermined decimal value, and the digital circuit 420 replaces the decimal value of the digital output with the predetermined correction to accomplish correction.

It should be noted that people of ordinary skill in the art can ascertain what kind of correction (i.e., the aforementioned predetermined correction) is appropriate for a specific metastable binary comparison-results sequence based on theory and/or practice in advance, and thereby use this kind of correction to correct a specific digital output of the SAR ADC 410 when the specific digital output is related with the specific metastable binary comparison-results sequence. For instance, the incorrect comparison results "00011" of FIG. 3 are related with a metastable binary comparison-results sequence corresponding to a binary digital output "11101" (i.e., the analog-to-digital conversion results of the SAR ADC 410, which are equivalent to the decimal value "29"); the correct comparison results "00111" (as shown in FIG. 2) are corresponding to another binary digital output "11001" (i.e., the analog-to-digital conversion results of SAR ADC 410, which are equivalent to the decimal value "25"); accordingly, when the digital output of the SAR ADC 410 is in the form of comparison results, if the digital circuit 420 determines that the digital output of the SAR ADC 410 conforms to the pattern of the incorrect comparison results "00011", the digital circuit 420 will replace the digital output with the predetermined correction "00111" Similarly, when the digital output of the SAR ADC 410 is in the form of analog-to-digital conversion results, if the digital circuit 420 determines that the digital output of the SAR ADC 410 conforms to the pattern of the binary digital output "11101" (or the decimal value "29"), the digital circuit 420 will replace the digital output (i.e., the binary sequence "11101" or the decimal value "29") of the SAR ADC 410 with the predetermined correction "11001" (or the decimal value "25"). Since the above-mentioned comparison and replacement/correction operation for a sequence/value can be realized by the current arts, the detail is omitted here.

In some circumstance the digital circuit 420 determines that a digital output of the SAR ADC 410 conforms to a metastable output but the digital output approximates to the actual sampled input value (e.g., the decimal value "23", corresponding to the comparison results "01000" of FIG. 2, quite close to the actual sampled input value "24.9" of FIG. 2). In order to prevent treating a correct digital output as a metastable output or carrying out unnecessary correction, an embodiment of the present invention adds a redundant capacitor to a capacitor array of the SAR ADC 410, and carries out a redundant charge-redistribution operation by using the redundant capacitor after finishing a normal comparison operation and obtaining comparison results (e.g., the comparison results "01000", corresponding to the analog-to-digital conversion results "10111", of FIG. 2), so as to carry out a redundant comparison operation for generating a redundant comparison result. Since the redundant charge-redistribution operation will have the original analog-to-digital conversion results approximate to the actual sampled input value by a predetermined variation (e.g., when a value (i.e., the decimal value "23") of the original analog-to-digital conversion results "10111" is less than the actual sampled input value, the redundant charge-redistribution operation equivalently adds the original analog-to-digital conversion results "10111" (i.e., the decimal value "23") and "00110" (i.e., the predetermined variation being the decimal value "6") up; and when a value of the original analog-to-digital conversion results is larger than the actual sampled input value, the redundant charge-redistribution operation equivalently subtracts "00110" from the original conversion analog-to-digital results "10111"), if the redundant comparison result is the same as the last one of the comparison results generated by the normal comparison operation of the SAR ADC 410, the difference between the value of the original analog-to-digital conversion results and the actual sampled input value will be found larger than the predetermined variation; accordingly, correction to the digital output is necessary. On the contrary, if the redundant comparison result is different from the last one of the comparison results generated by the normal comparison operation of the SAR ADC 410, the difference between the value of the original analog-to-digital conversion results and the actual sampled input value will be found less than the predetermined variation; accordingly, correction to the digital output is unnecessary. In an embodiment of the present invention, the aforementioned capacitor array of the SAR ADC includes an LSB capacitor and the redundant capacitor, and the capacitance of the redundant capacitor is greater than the capacitance of the LSB capacitor; for instance, the capacitance of the redundant capacitor is six times the capacitance of the LSB capacitor. The LSB capacitor, among the capacitors of the capacitor array, has the minimum capacitance.

Figure 5:
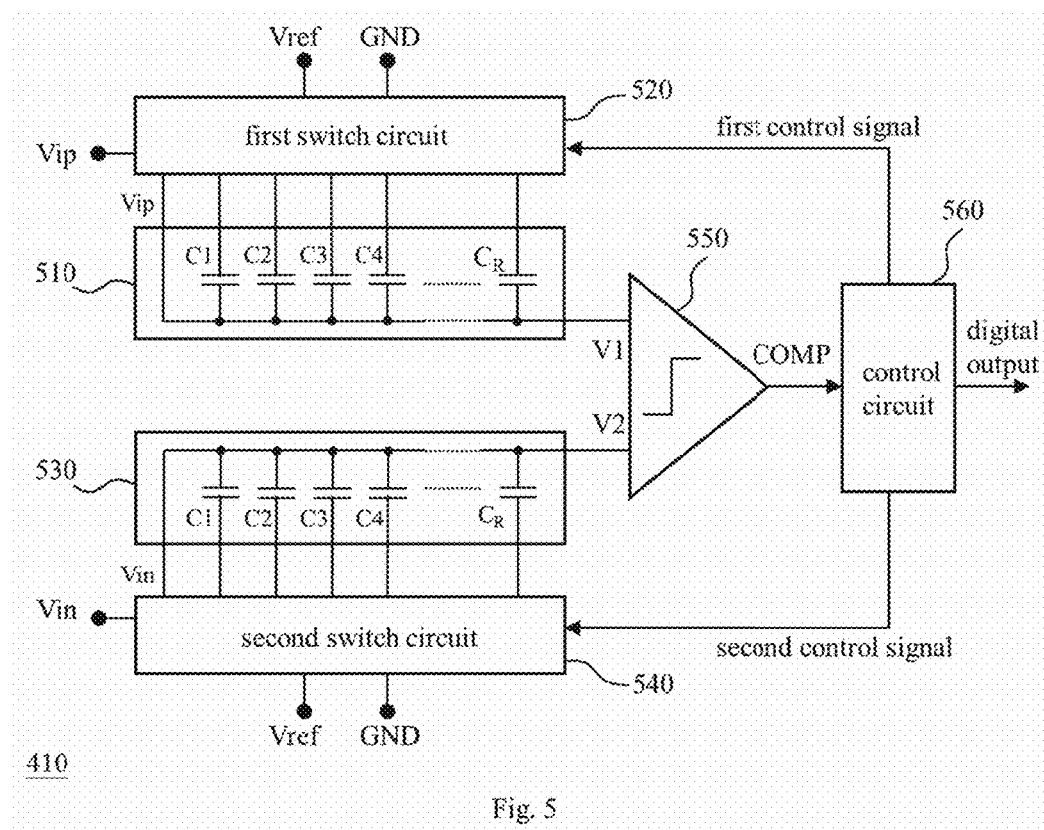
FIG. 5 illustrates an embodiment of the SAR ADC of FIG. 4.

On the basis of the above, FIG. 5 shows an embodiment of the SAR ADC 410 with the redundant capacitor. The SAR ADC 410 of FIG. 5 includes: a first capacitor array 510 configured to sample a positive-end signal Vip of a differential signal and output a first input signal V1, and the first capacitor array 510 including capacitors C1, C2, C3, C4 . . . and a redundant capacitor $C_R$ which is mainly used for the aforementioned redundant charge-redistribution operation and the aforementioned redundant comparison operation; a first switch circuit 520 configured to control a coupling relation between the first capacitor array 510 and a reference voltage node Vref (or a high voltage node) and a coupling relation between the first capacitor array 510 and a ground voltage node GND (or a low voltage node) according to a first control signal, so as to realize charge-redistribution and control the amplitude of the first input signal V1; a second capacitor array 530 configured to sample a negative-end signal Vin of the differential signal and output a second input signal V2, and the second capacitor array 530 including capacitors C1, C2, C3, C4 . . . and a redundant capacitor $C_R$ which is mainly used for the redundant charge-redistribution operation and the redundant comparison operation; a second switch circuit 540 configured to control a coupling relation between the second capacitor array 530 and the reference voltage Vref node (or the high voltage node) and a coupling relation between the second capacitor array 530 and the ground voltage node GND (or the low voltage node) according to a second control signal, so as to realize charge-redistribution and control the amplitude of the second input signal V2; a comparator 550 configured to compare the first input signal V1 with the second input signal V2 and thereby output a comparison result (COMP); and a control circuit 560 configured to generate the first control signal and the second control signal according to the comparison result and output at least a part of the aforementioned digital output. It should be noted that the operation of the SAR ADC 410 is similar to the operation of a general SAR ADC, and the major change is that the SAR ADC 410 of FIG. 5 carries out the redundant charge-redistribution operation and the redundant comparison operation which are similar/identical to the charge-redistribution operation and the comparison operation of the general SAR ADC; therefore, the operation detail of the SAR ADC 410 is omitted here. People of ordinary skill in the art can understand the SAR ADC 410 of FIG. 5 more by referring to the following literature: Hongda Xu[1], Yongda Cai[1], Ling Du[2], Yuan Zhou[3], Benwei Xu[3], Datao Gong[4], Jingbo Ye[4], Yun Chiu[3], "A 78.5 dB-SNDR Radiation and Metastability-Tolerant Two-Step Split SAR ADC Operating up to 75MS/s with 24.9 mW Power Consumption in 65 nm CMOS", ISSCC 2017/SESSION 28/HYBRID ADCs/ 28.6. ([1]University of Texas at Dallas, Richardson, Tex.; [2]University of Electronic Science and Technology of China, Chengdu, China; [3]Broadcom, Irvine, Calif.; [4]Southern Methodist University Dallas, Tex.).

A plurality of capacitors in a capacitor array of a general SAR ADC usually include a capacitor 2C, a capacitor 4C, a capacitor 8C, a capacitor 16C . . . , in which "C" stands for the capacitance of a unit capacitor and the capacitance of the unit capacitor can be set by those of ordinary skill in the art. Among the plurality of capacitors, a ratio of capacitance of one capacitor to capacitance of another capacitor is a power of two (i.e., $2^Y$, in which Y is a positive integer) or "½[Y]". The SAR ADC 410 of the present invention can carry out a normal comparison operation by using the above-described capacitor array (e.g., the capacitors C1, C2, C3, C4 . . . of the capacitor arrays 510, 530 in FIG. 5 are the capacitors 2C, 4C, 8C, 16C . . . , respectively). However, in order to improve the accuracy of the digital output of the SAR ADC 410, in an embodiment of the present invention, the capacitor array of the SAR ADC 410 includes redundant capacitance for the normal comparison operation (i.e., the comparison operation except the aforementioned redundant comparison operation); for instance, the capacitors C1, C2, C3, C4 . . . of FIG. 5 are capacitors 3C, 4C, 7C, 13C . . . , respectively.

According to the preceding paragraphs, the digital circuit 420 determines whether the digital output conforms to the metastable output in accordance with the successive K comparison results of the metastable binary comparison-results sequence, in which the K comparison results includes the first comparison result, the second comparison result and the successive M comparison results in turn. In an embodiment of the present invention, the successive K comparison results relate to the charge-redistribution operation of K capacitors in a capacitor array of the SAR ADC 410, in which the K capacitors (e.g., 13C, 7C, 4C and 3C when K=4; or 32C, 24C, 16C, 8C, 4C and 2C when K=6) have different capacitance and include a first capacitor (e.g., 13C or 32C), a second capacitor (e.g., 7C or 24C) and M capacitors (e.g., 4C and 3C; or 16C, 8C, 4C and 2C). The capacitance of the first capacitor is greater than the capacitance of the second capacitor, a ratio of the capacitance of the first capacitor to the capacitance of the second capacitor is not equal to a power of two, and the capacitance of the second capacitor is less or not greater than the sum of the capacitance of the M capacitors. The above-mentioned feature is useful to ensure the accuracy of the decision of the digital circuit 420 when the digital circuit 420 determines whether the digital output conforms to the metastable output.

It should be noted that although the SAR ADC 410 of FIG. 4 and FIG. 5 using the differential signal, this is not a limitation to the implementation of the present invention. People of ordinary skill in the art can appreciate that the present invention is applicable to the circuit using a single-ended signal by referring to the present disclosure. It should be also noted that if an implementation derived from one or more of the aforementioned embodiments is practicable, a person of ordinary skill in the art can selectively make use of some or all of the features in one embodiment or selectively make use of the combination of some or all features in several embodiments to have the implementation come true, so as to increase the flexibility of carrying out the present invention.

To sum up, the present invention can effectively solve the metastable problem of an SAR ADC in a manner of low complexity and power consumption.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A correcting device of successive approximation analog-to-digital conversion, comprising:
   a successive approximation register analog-to-digital converter (SAR ADC) configured to generate a digital output; and
   a digital circuit configured to determine whether the digital output conforms to a metastable output, and configured to correct the digital output according to predetermined correction when the digital output conforms to the metastable output,
   wherein the metastable output is related with a metastable binary comparison-results sequence including successive K comparison results, the successive K comparison results include a first comparison result, a second comparison result and M comparison results in turn, the first comparison result and the second comparison result are identical, the M comparison results are identical, each of the first comparison result and the second comparison result is different from any of the M comparison results, and each of the K and the M is a positive integer.

2. The correcting device of successive approximation analog-to-digital conversion of claim 1, wherein the M is not less than two.

3. The correcting device of successive approximation analog-to-digital conversion of claim 1, wherein the SAR ADC carries out a comparison operation for plural times and thereby generates the digital output; after the SAR ADC finishes carrying out the comparison operation, the SAR ADC carries out a redundant comparison operation and thereby generates a redundant comparison result; and after the redundant comparison result is identical to a last comparison result obtained by carrying out the comparison operation, the digital circuit determines whether the digital output conforms to the metastable output.

4. The correcting device of successive approximation analog-to-digital conversion of claim 3, wherein the SAR ADC includes a capacitor array including a least-significant-bit (LSB) capacitor and a redundant capacitor; capacitance of the redundant capacitor is greater than capacitance of the LSB capacitor; and the SAR ADC uses the redundant capacitor to carry out a redundant charge-redistribution operation and then carries out the redundant comparison operation, so as to generate the redundant comparison result.

5. The correcting device of successive approximation analog-to-digital conversion of claim 3, wherein the SAR ADC includes a capacitor array including K capacitors; the K capacitors includes a first capacitor, a second capacitor and M capacitors; a ratio of capacitance of the first capacitor to capacitance of the second capacitor is not equal to a power of two; and the capacitance of the first capacitor is greater than the capacitance of the second capacitor.

6. The correcting device of successive approximation analog-to-digital conversion of claim 5, wherein a sum of capacitance of the M capacitors is less than the capacitance of the second capacitor.

7. The correcting device of successive approximation analog-to-digital conversion of claim 1, wherein the SAR ADC includes a capacitor array including K capacitors; the K capacitors includes a first capacitor, a second capacitor and M capacitors; a ratio of capacitance of the first capacitor to capacitance of the second capacitor is not equal to a power of two; and the capacitance of the first capacitor is greater than the capacitance of the second capacitor.

8. The correcting device of successive approximation analog-to-digital conversion of claim 7, wherein a sum of capacitance of the M capacitors is less than the capacitance of the second capacitor.

9. The correcting device of successive approximation analog-to-digital conversion of claim 1, wherein the digital output is a binary sequence composed of comparison results of the SAR ADC or composed of analog-to-digital conversion results of the SAR ADC; and the digital circuit determines whether the digital output conforms to the metastable output according to one of following manners: determining whether a pattern of the binary sequence is identical to a pattern of the metastable binary comparison-results sequence; and determining whether the pattern of the binary sequence is identical to a pattern of an analog-to-digital output sequence corresponding to the metastable binary comparison-results sequence.

10. The correcting device of successive approximation analog-to-digital conversion of claim 9, wherein the predetermined correction is a predetermined binary sequence or includes predetermined X sequential values, and the digital circuit replaces or corrects the digital output with the predetermined correction, in which the X is an integer not less than the K.

11. The correcting device of successive approximation analog-to-digital conversion of claim 1, wherein the digital output is a decimal value; and the digital circuit determines whether the decimal value is identical to a metastable decimal value corresponding to the metastable binary comparison-results sequence so as to determine whether the digital output conforms to the metastable output.

12. The correcting device of successive approximation analog-to-digital conversion of claim 11, wherein the predetermined correction is a predetermined decimal value, and the digital circuit replaces or corrects the digital output with the predetermined correction.

* * * * *